(12) United States Patent
Meng

(10) Patent No.: US 9,798,053 B2
(45) Date of Patent: Oct. 24, 2017

(54) MASK PLATE, COLOR FILTER SUBSTRATE AND METHOD FOR FABRICATING THE SAME, DISPLAY PANEL AND DISPLAY DEVICE

(71) Applicants: BOE Technology Group Co., Ltd., Beijing (CN); Hefei BOE Optoelectronics Technology Co., Ltd., Anhui (CN)

(72) Inventor: Qingyong Meng, Beijing (CN)

(73) Assignees: BOE Technology Group Co., Ltd., Beijing (CN); Hefei BOE Optoelectronics Technology Co., Ltd., Anhui (CN)

(*) Notice: Subject to any disclaimer, the term of this patent is extended or adjusted under 35 U.S.C. 154(b) by 0 days.

(21) Appl. No.: 15/084,006

(22) Filed: Mar. 29, 2016

(65) Prior Publication Data
US 2016/0291221 A1    Oct. 6, 2016

(30) Foreign Application Priority Data

Apr. 1, 2015    (CN) .......................... 2015 1 0152639

(51) Int. Cl.
| | | |
|---|---|---|
| *G03F 1/54* | (2012.01) | |
| *G02B 5/20* | (2006.01) | |
| *G02B 5/00* | (2006.01) | |
| *G02B 5/22* | (2006.01) | |
| *G03F 7/00* | (2006.01) | |
| *G02F 1/133* | (2006.01) | |
| *G02F 1/1335* | (2006.01) | |

(52) U.S. Cl.
CPC ............ *G02B 5/201* (2013.01); *G02B 5/003* (2013.01); *G02B 5/22* (2013.01); *G02F 1/133* (2013.01); *G03F 1/54* (2013.01); *G03F 7/0007* (2013.01); *G02B 5/223* (2013.01); *G02F 1/133514* (2013.01); *G02F 1/133516* (2013.01)

(58) Field of Classification Search
CPC ..... G03F 1/00; G03F 1/50; G03F 1/54; G03F 1/58; G03F 7/0007; G02B 5/201; G02B 5/22; G02B 5/223; G02F 1/133514; G02F 1/133516; G02F 1/1333; G02F 1/13394
USPC .................................. 430/5, 7; 349/106, 156
See application file for complete search history.

(56) References Cited

U.S. PATENT DOCUMENTS

| | | | | |
|---|---|---|---|---|
| 2006/0103786 A1* | 5/2006 | Koma | ............... | G02F 1/133371 349/107 |
| 2007/0002218 A1* | 1/2007 | Park | .................. | G02F 1/133514 349/106 |

\* cited by examiner

*Primary Examiner* — John A McPherson
(74) *Attorney, Agent, or Firm* — Banner & Witcoff, Ltd.

(57) ABSTRACT

A mask plate, a color filter substrate and a method for fabricating the same, a display panel and display device are disclosed. The mask plate includes a light transmitting region having at least two light transmittance levels, wherein the light transmittance level of the light transmitting region corresponding to a black matrix is configured to be increased from a central region of the mask plate to a peripheral region of the mask plate.

15 Claims, 8 Drawing Sheets cross-section view    plan view cross-section view    plan view light transmittance 100% light transmittance 60%

H1

H2    H1>H2 light transmittance 100% light transmittance 80% light transmittance 60%

H1

H2    H1>H2>H3

H3

MASK PLATE, COLOR FILTER SUBSTRATE AND METHOD FOR FABRICATING THE SAME, DISPLAY PANEL AND DISPLAY DEVICE

This application claims priority to and the benefit of Chinese Patent Application No. 201510152639.6 filed on Apr. 1, 2015, which application is incorporated herein in its entirety.

FIELD OF THE ART

Embodiments of the invention relate to display technical area, especially relate to a mask plate, a color filter substrate and a method for fabricating the same, a display panel and a display device.

BACKGROUND

Currently, with the promotion of production line in liquid crystal field, the sizes of substrates to be produced become ever bigger and the requirement of the defect-free rate becomes ever higher, which cause a series of problems. For example, during the fabricating process of a color filter substrate, because the color filter substrate has too large an area, in-plane pressure distribution across a color filter substrate is uneven, which results in a limitation on the product design.

Particularly, during the fabrication of post spacers, as illustrated in FIG. 1, an area of a mask plate 2 which is configured to fabricate the post spacers is relatively large as a color filter substrate 1 has too large an area. A central region of the mask plate 2 will bend and sag due to gravity, causing an exposing distance h1 of a peripheral region of the mask plate 2 being 50 μm to 70 μm larger than an exposing distance h2 of the central region. When a positive photoresist is used, the photoresist in an exposed region is removed through a developing process and the post spacers to be retained are disposed in a non-exposing region, thus a height of the formed post spacers will not be affected by the exposure process. However, in the case that a negative photoresist is used, the post spacers to be retained is disposed in the exposing region and the photoresist in non-exposing region is removed through a developing process, thus the height of the formed post spacers made from the negative photoresist is affected by the exposure process. As a result, a height of post spacers in the central region is larger than that of post spacers in the peripheral region, thereby compromising the uniformity of the color filter substrate.

SUMMARY

Embodiments of the invention provide a mask plate, a color filter substrate and a method for fabricating the same, a display panel and a display device, so as to solve the problem that top surfaces of a plurality of post spacers not being in a same horizontal plane caused by different exposing distances in one panel due to too large an area of a mask plate in conventional arts.

In a first respect of the present invention, it is provided a mask plate, comprising: a light transmitting region having at least two light transmittance levels, wherein the light transmittance level of the light transmitting region corresponding to a black matrix is configured to be increased from a central region of the mask plate to a peripheral region of the mask plate.

In a second respect of the present invention, it is provided a method for fabricating a color filter substrate, comprising: providing a color filter base substrate; forming a patterned black matrix on the color filter substrate; forming a patterned color filter layer by using the mask plate of any of claims 1 to 4 on the color filter base substrate having the black matrix formed thereon, wherein a height of a color filter layer which is formed by using the central region of the mask plate is smaller than that of a color filter layer which is formed by using the peripheral region of the mask plate; forming a plurality of post spacers disposed on the color filter layer and in the region corresponding to the black matrix, wherein top surfaces of the plurality of post spacers are of the same horizontal level.

In a third respect of the present invention, it is provided a color filter substrate, comprising: a color filter base substrate; a patterned black matrix disposed on the color filter base substrate; a patterned color filter layer disposed on the color filter base substrate having the black matrix formed thereon, wherein a height of a color filter layer formed by using the central region of the above mask plate is smaller than that of a color filter layer formed by using the peripheral region of the mask plate; a plurality of post spacers disposed on the color filter layer and in a region corresponding to the black matrix, wherein top surfaces of the plurality of post spacers away from the color filter base substrate are of the same horizontal level.

In a fourth respect of the present invention, it is provided a display panel comprising the above color filter substrate.

In a fifth respect of the present invention, it is provided a display device comprising the above display panel.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

In embodiments of the invention, by using a mask plate having at least two light transmittance levels to fabricate a color filter layer during the fabricating process of a color filter substrate, a height of the color filter layer disposed in a central region which is configured to form the post spacers is smaller than that of the color filter layer disposed in the peripheral region which is configured to form the post spacers, thereby compensating the subsequent defect that the top surfaces of the post spacers in different regions being not in a same horizontal plane caused by a too large area of the mask plate.

Figure 2:
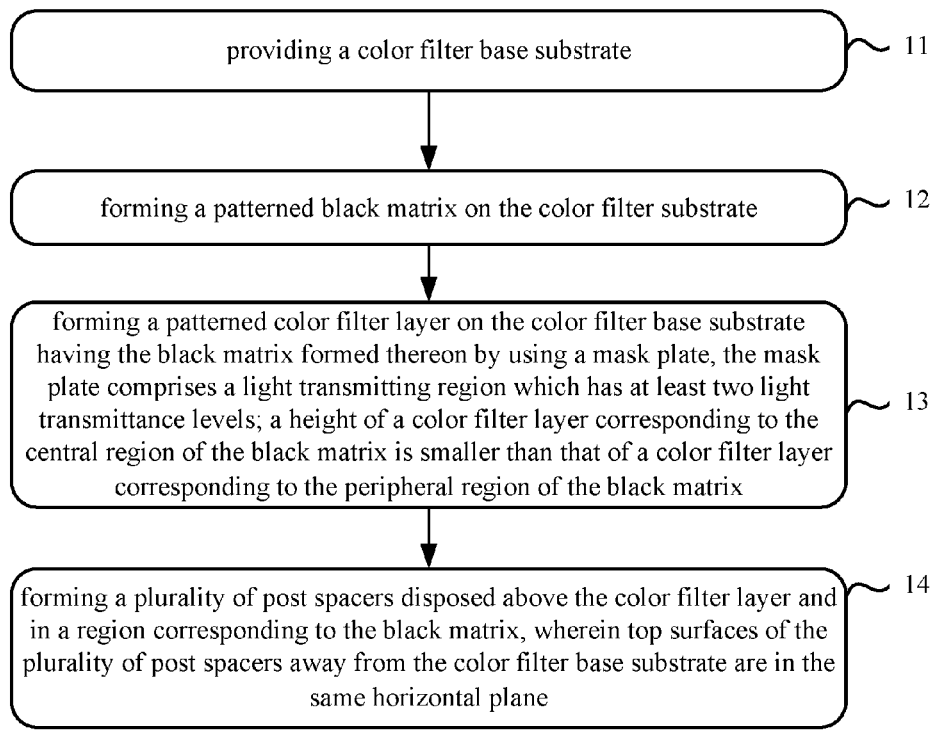
FIG. 2 schematically illustrates a flow chart of a method for fabricating a color filter substrate in accordance with an embodiment of the invention.

FIG. 2 schematically illustrates a method for fabricating a color filter substrate in accordance with an embodiment of the invention, which comprises the following steps:

Step 11: providing a color filter base substrate.

Figure 3:
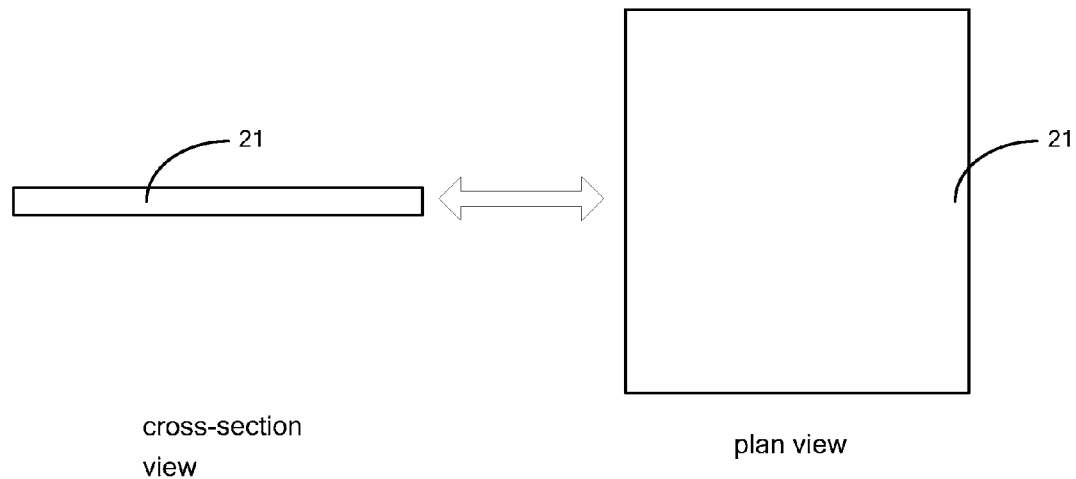
FIGS. 3(a) to 3(c) schematically illustrate a process of fabricating a color filter substrate in accordance with an embodiment of the invention.
Figure 3:
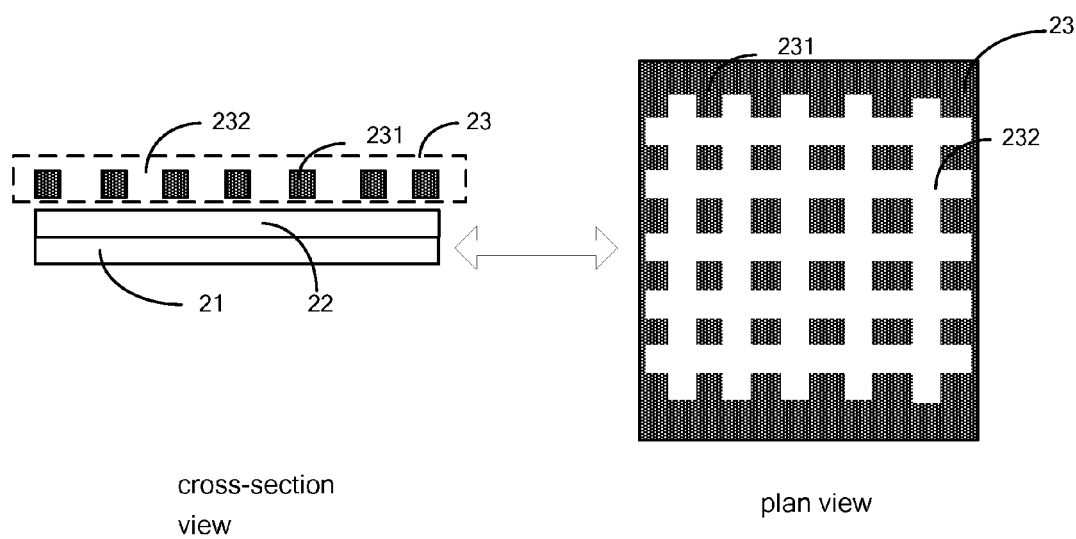
Figure 3:
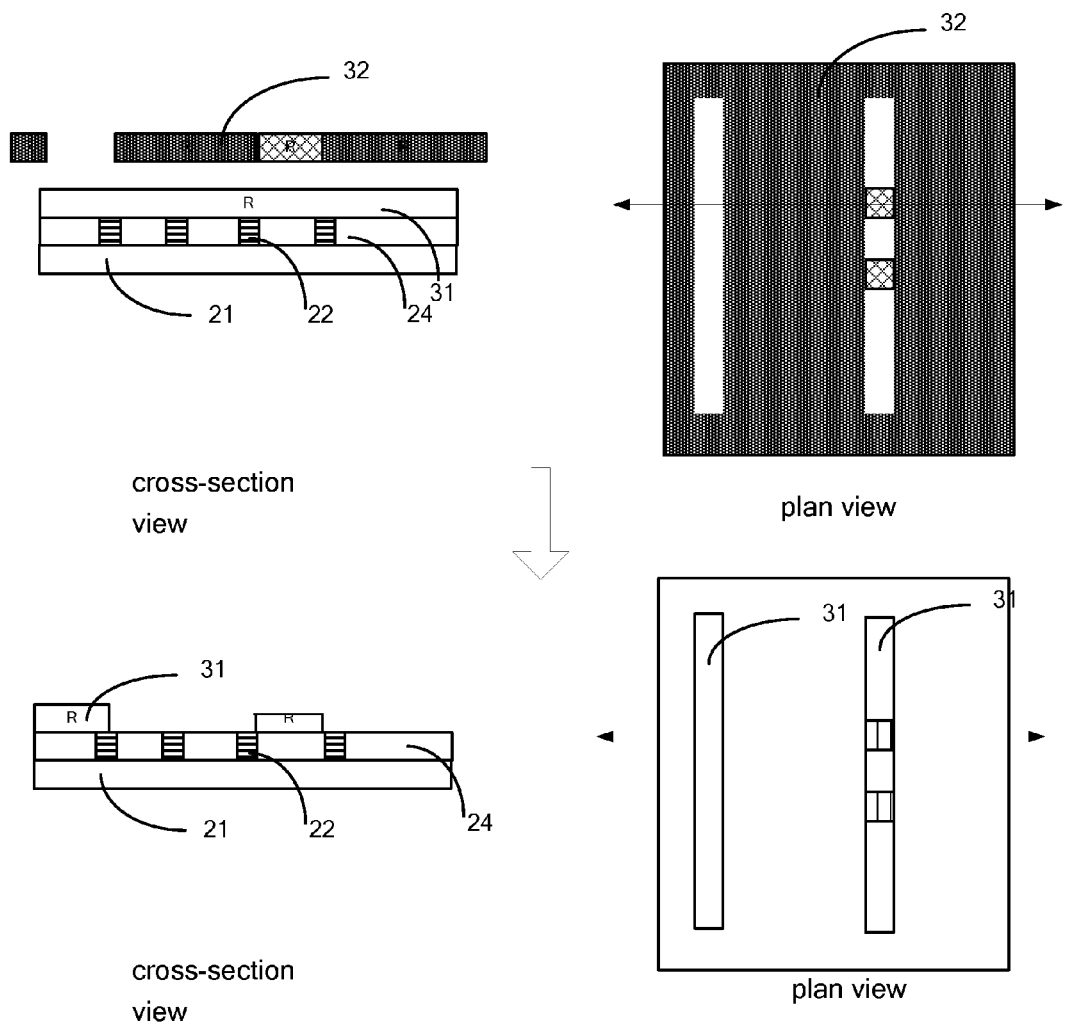

As an example, as illustrated in FIG. 3(a), the color filter base substrate is a base substrate 21 with a large size, which may be made of glass, quartz or metal, etc.

Step 12: forming a patterned black matrix on the color filter substrate.

As an example, as illustrated in FIG. 3(b), during the fabricating process of a black matrix 22, the distribution of shielding regions 231 and of non-shielding regions 232 of a mask plate 23 is substantially even. Even if the exposing height of a central region is larger than that of a peripheral region due to too large area of the mask plate, as the distribution of the shielding regions 231 and of the non-shielding regions 232 is substantially even, the formed black matrix will not have a large height difference and the flatness of the subsequent film surface will not be affected.

As an example, after the black matrix 22 is formed, a layer of a transparent barrier layer 24 is applied on the black matrix 22 to avoid the interaction of the base substrate and a color filter layer.

Step 13: forming a patterned color filter layer on the color filter base substrate having the black matrix formed thereon by using a mask plate, the mask plate comprises a light transmitting region which has at least two light transmittance levels; a height of a color filter layer corresponding to the central region of the black matrix is smaller than that of a color filter layer corresponding to the peripheral region of the black matrix.

Figure 1:
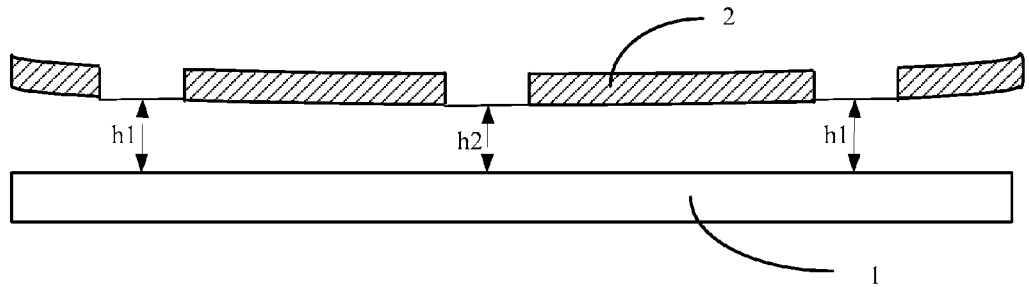
FIG. 1 schematically illustrates a principle of fabricating post spacers according to conventional arts.
Figure 4:
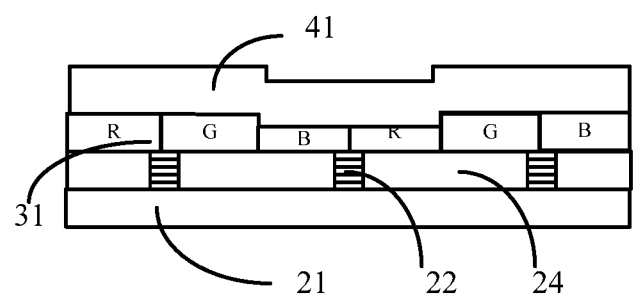
FIGS. 4(a) to 4(b) schematically illustrate a process of fabricating post spacers of the color filter substrate in accordance with an embodiment of the invention.
Figure 4:
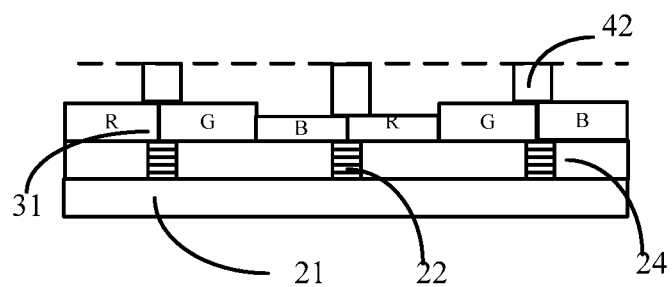

To solve the problem that the top surfaces of post spacers are not in a same horizontal plane as illustrated in FIG. 1, the embodiment of the invention makes an improvement in step 13. Specifically, as illustrated in FIG. 3(c), forming a patterned color filter layer 31 by using the mask plate 32 on the color filter base substrate having the black matrix formed thereon, the mask plate 32 comprises a light transmitting region which has at least two light transmittance levels. The height of the color filter layer (mesh shape) corresponding to the central region of the black matrix is smaller than that of the color filter layer (lattice shape) corresponding to the peripheral region of the black matrix. As illustrated in FIG. 4(b), a post spacer 42 is formed on the color filter layer 31 and the black matrix 22 is disposed under the post spacer 42. As an example, an area of the light transmitting region configured to form the post spacer 42 is larger than a projected area of the post spacer 42 to be formed on the color filter substrate. A shape of the light transmitting region of the mask plate configured to form the post spacer may be rectangle, circular or oval, etc. The uniformity degree of the subsequently formed post spacers depends on the number of the light transmittance levels of the mask plate configured to fabricate the color filter layer. The more the number of the light transmittance levels of the mask plate is, the better uniformity the subsequently formed post spacers will have.

As an example, the step 13 comprises:

applying a first color filter material on the color filter base substrate having the black matrix formed thereon and forming a patterned first color filter layer using the mask plate;

applying a second color filter material on the color filter base substrate having the first color filter layer formed thereon and forming a patterned second color filter layer using the mask plate;

applying a third color filter material on the color filter base substrate having the second color filter layer formed thereon and forming a patterned third color filter layer using the mask plate;

the first, second and third color filter layer all meet the following requirement: the height of the color filter layer corresponding to the central region of the black matrix is smaller than that of the color filter layer corresponding to the peripheral region of the black matrix.

It is noted that, in the embodiment of the invention, the first, second and third color filter layer are respectively red (R), green (G), blue (B) color filter layer, and the sequence of forming the three color filter layer is adjustable.

As an example, a value range of the light transmittance level of the mask plate is from 60% to 100%.

Step 14: forming a plurality of post spacers disposed above the color filter layer and in a region corresponding to the black matrix, wherein top surfaces of the plurality of post spacers away from the color filter base substrate are in the same horizontal plane (i.e., are of same horizontal level).

As an example, the step of forming a plurality of post spacers disposed above the color filter layer and in a region corresponding to the black matrix comprises:

applying a layer of organic material configured to fabricate the post spacers and a photoresist layer on the color filter layer which has height difference; and exposing and developing the organic material and the photoresist layer by using the mask plate to form the plurality of post spacers. For example, a negative photoresist is used in this step.

In the embodiment of the invention, the height of the color filter layer which is configured to form the post spacers and disposed in the central region of the color filter substrate is smaller than that of the color filter layer which is configured to form the post spacers and disposed in the peripheral region of the color filter substrate. The organic material configured to form the post spacers and the negative photoresist are applied on the color filter layer which is inhomogeneous in height. A thickness of the layer of the post spacers which is approximately 5-6 μm is larger than a thickness of the layer of color filter material which is approximately 3 μm. However, the layer coatings in micrometer scale cannot conceal the inhomogeneous height of the color filter layer. Due to the above fact, after a mixture 41 of the organic material and negative photoresist is applied, the surface of the color filter substrate is still inhomogeneous in height, which is referred to the cross section as illustrated in FIG. 4(a). However, as the thickness of the color filter layer is inhomogeneous, the height difference of the subsequently formed post spacers will be compensated. As a result, the top surfaces of the post spacers 42 are almost in a same horizontal plane, as illustrated in FIG. 4(b), thereby guaranteeing the flatness of the panel and being helpful to the subsequent panel assembly.

The method for fabricating the color filter substrate of the embodiment of the invention will be described through the following examples.

EXAMPLE 1

Figure 5:
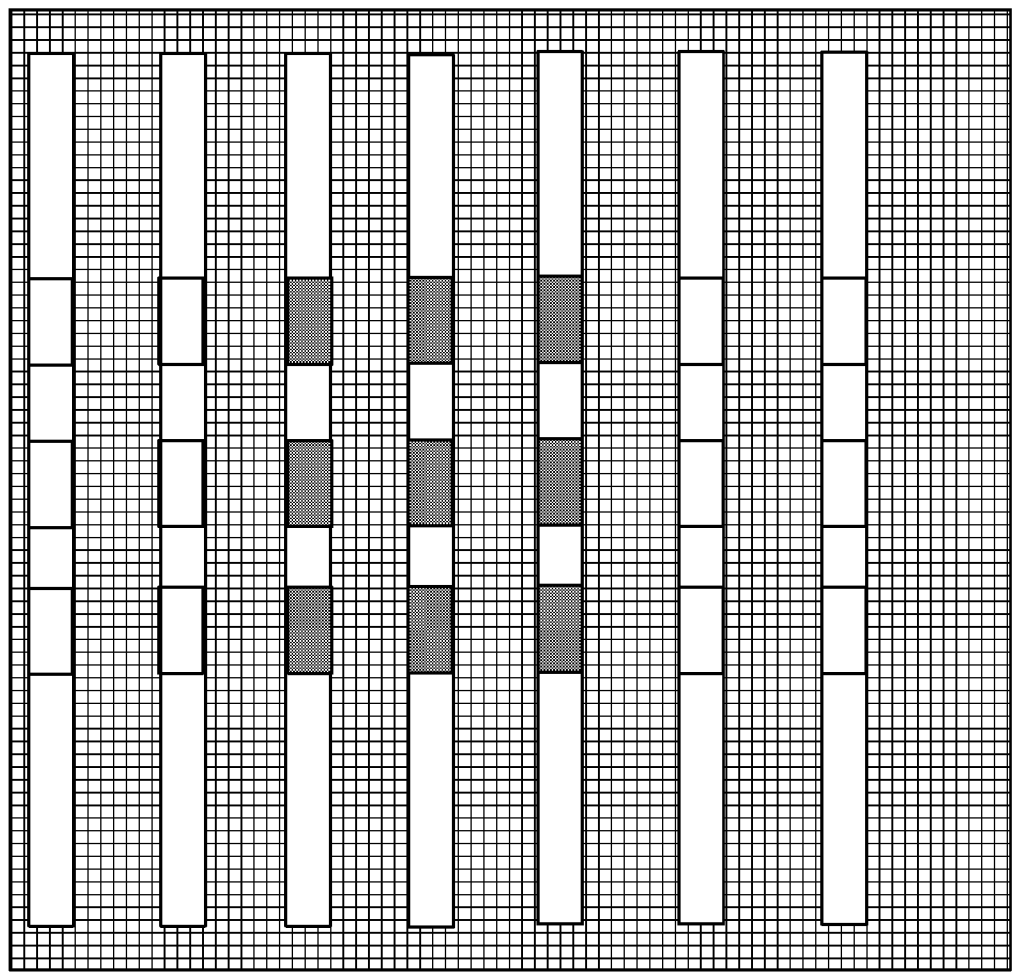
FIGS. 5(a) to 5(b) schematically illustrate a process of fabricating a color filter layer using a mask plate having two light transmittance levels.
Figure 5:
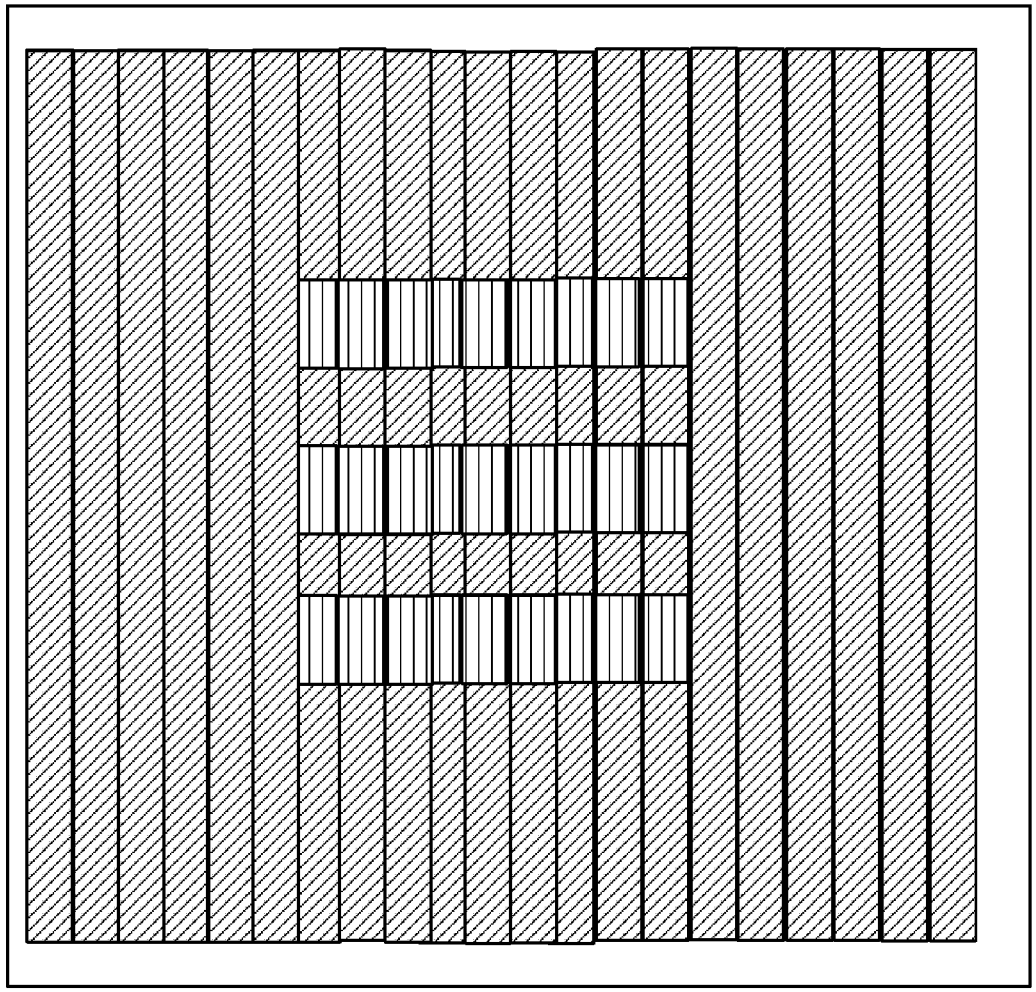
Figure 5:
Figure 5:

A Mask Plate Configured to Form a Color Filter Layer Comprises a Light Transmitting Region Having Two Light Transmittance Levels After forming a black matrix on a color filter substrate, R/G/B color filter layer is formed in sequence, wherein the sequence is adjustable. It will be described as R, G and B in sequence in this example. The mask plate in the example has two light transmittance levels and comprises a light-completely-transmitting region and a light-partially-transmitting region. The light-partially-transmitting region is disposed in the central region and has a value range of light transmittance level of more than 60% and less than 100%. FIG. 5(a) schematically illustrates a part of a color filter mask plate of the example. A light transmittance level of an exposing region (blank region) disposed in the peripheral region of the color filter mask plate is approximately 100% and a light transmittance level of an exposing region (dense mesh region) disposed in the central region is approximately 60%. When fabricating the color filter layers with different colors, the mask plate is staggered by one color filter strip. The mask plate is exposed in position for three times (the position of the mask plate is staggered by one strip color filter during every exposure) to form the R/G/B pixel unit in sequence. As a result, as illustrated in FIG. 5(b), a height of the pixel units disposed in the region (vertical stripes region) which is configured to form the post spacers in the central region is H2, heights of the pixel units disposed in the remaining region (left inclined stripes region) are all H1, and H1>H2.

EXAMPLE 2

A Mask Plate Configured to Form a Pixel Unit Comprises a Light Transmitting Region Having Three Light Transmittance Levels To increase the height uniformity of post spacers in a panel, it is possible to define more light transmittance levels so that a precision of light transmittance levels partition is increased, thereby increasing gradient distribution of pixel units in the whole panel and improving a flatness of the panel.

Figure 6:
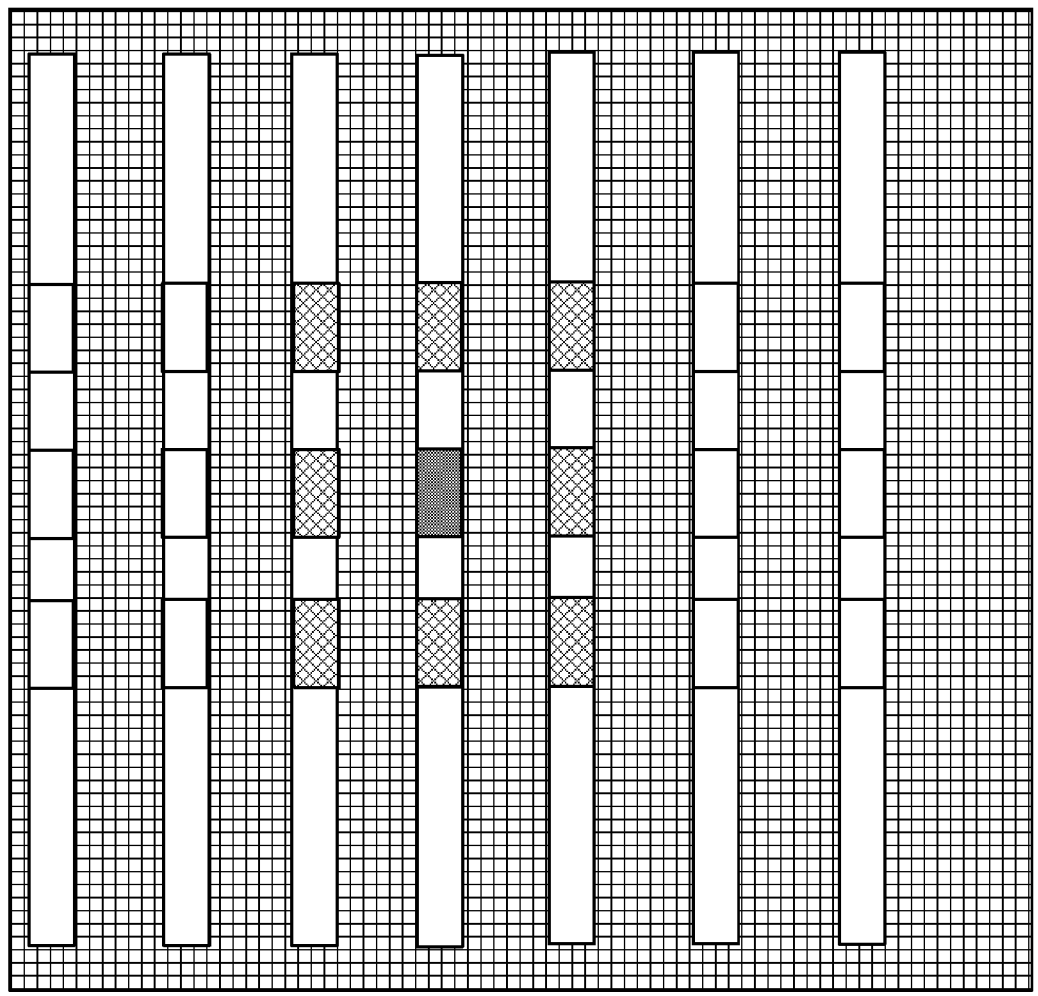
FIGS. 6(a) to 6(b) schematically illustrate a process of fabricating a color filter layer using a mask plate having three light transmittance levels.
Figure 6:
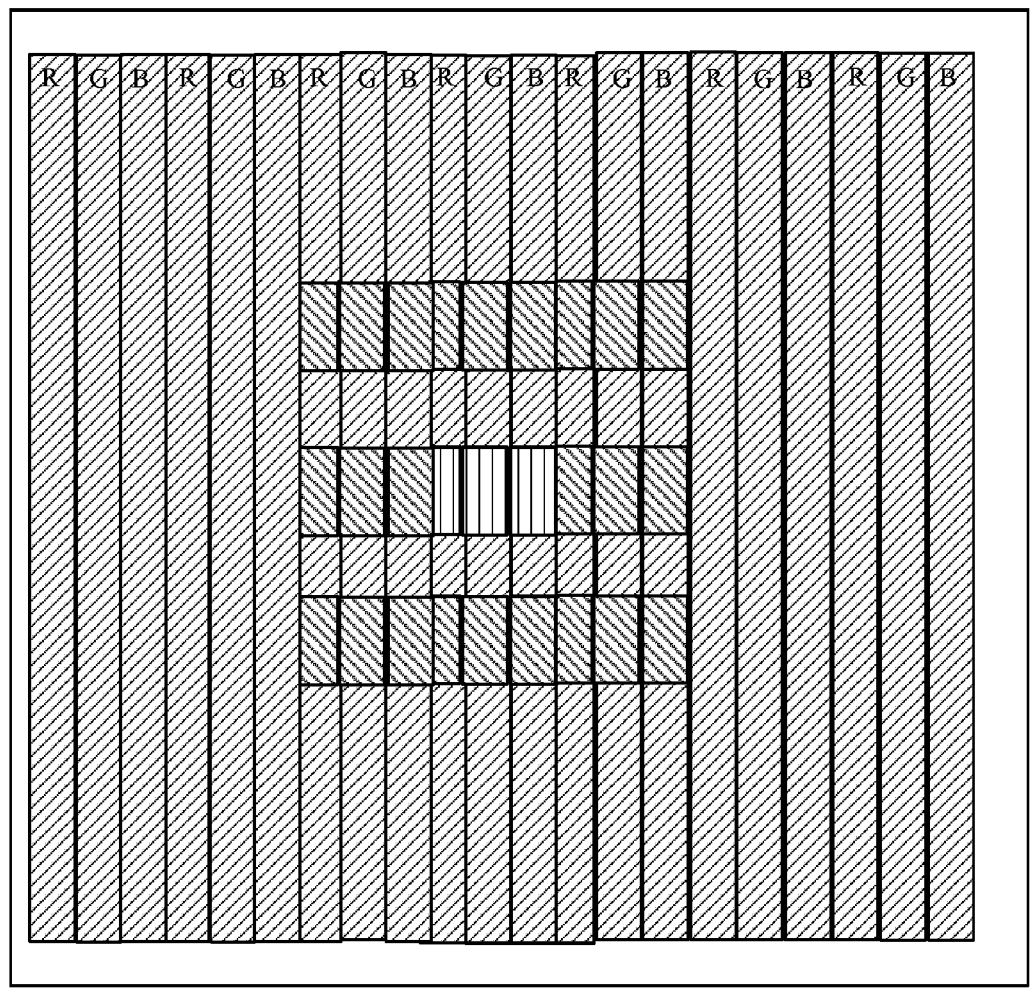

The mask plate in the example has three light transmittance levels and comprises a light-completely-transmitting region and two light-partially-transmitting regions. FIG. 6(a) schematically illustrates a part of a color filter mask plate, wherein a light transmittance level of an exposing region (blank region) disposed in a peripheral region of the color filter mask plate is approximately 100%, a light transmittance level of an exposing region (sparse mesh region) disposed near a central region is approximately 80%, and a light transmittance level of an exposing region (dense mesh region) disposed in the central region is approximately 60%. Similarly with example 1, when fabricating the color filter layers with different colors, the mask plate is staggered by one color filter strip. As a result, as illustrated in FIG. 6(b), a height of the color filter layer disposed in the region (vertical stripes region) which is configured to form the post spacers in the central region is H3, a height of the color filter layer disposed near the central region (right inclined stripes region) are H2, a height of the color filter layer disposed in the remaining region (left inclined stripes region) is H1, and H1>H2>H3.

The embodiment of the invention further provides a color filter substrate which has a same conception as the method for fabricating above color filter substrate, the color filter substrate comprises:

a color filter base substrate;

a patterned black matrix disposed on the color filter base substrate;

a patterned color filter layer disposed on the color filter base substrate having the black matrix formed thereon, wherein a height of a color filter layer formed from the central region of the mask plate of above embodiments or examples is smaller than that of a color filter layer formed from the peripheral region of the mask plate;

a plurality of post spacers disposed on the color filter layer and in a region corresponding to the black matrix, wherein the top surfaces of the plurality of post spacers are in a horizontal plane.

As an example, the patterned color filter layer disposed on the color filter base substrate having the black matrix formed thereon comprises:

a plurality of first color filter layer, second color filter layer and third color filter layer which are of strip shape and are alternately arranged;

the first, second and third color filter layer all meet the following requirement: a height of the color filter layer formed from the central region of the mask plate of above embodiments or examples is smaller than that of the color filter layer formed from the peripheral region of the mask plate.

As an example, in the region which is configured to form the plurality of post spacers, a height difference of the color filter layer between the central region and the peripheral region is larger than 0 and less than or equal to 0.05 µm.

As an example, a shape of the light transmitting region of the mask plate configured to form the post spacer may be rectangle, circular or oval and an area of the region is larger than a projected area of the post spacer to be formed on the color filter substrate.

The embodiment of the invention further provides a display panel comprising the color filter substrate of any of the above embodiments.

The embodiment of the invention further provides a display device comprising the above display panel, the display device may be a LCD display panel, a mobile phone, a tablet PC, a television, a display, a laptop computer, a digital photo-frame, a navigator or any products or components with a display function.

What is described above is related to the illustrative embodiments of the disclosure only and not limitative to the scope of the disclosure; the scopes of the disclosure are defined by the accompanying claims.

The present application claims priority from Chinese Application No. 201510152639.6 filed on Apr. 1, 2015, the disclosure of which is hereby incorporated by reference herein in its entirety.

What is claimed is:
1. A mask plate, comprising:
a light transmitting region having three light transmittance levels,
wherein the three light transmittance levels of the light transmitting region corresponding to a black matrix are configured to be increased from a central region of the mask plate to a peripheral region of the mask plate, and wherein among the three light transmittance levels, a light transmittance level of the light transmitting region corresponding to the black matrix in the peripheral region of the mask plate is 100%, a light transmittance level of the light transmitting region corresponding to the black matrix in the central region of the mask plate is 60%, and a light transmittance level of the light transmitting region corresponding to the black matrix in a region between the peripheral region and the central region of the mask plate is 80%.

2. A method for fabricating a color filter substrate, comprising:
   providing a color filter base substrate;
   forming a patterned black matrix on the color filter substrate;
   forming a patterned color filter layer by using the mask plate of claim 1 on the color filter base substrate having the black matrix formed thereon, wherein a height of a color filter layer which is formed by using the central region of the mask plate is smaller than a height of a color filter layer which is formed by using the peripheral region of the mask plate; and
   forming a plurality of post spacers disposed on the color filter layer and in the region corresponding to the black matrix, wherein top surfaces of the plurality of post spacers are at the same horizontal level.

3. The method of claim 2, wherein the step of forming a patterned color filter layer by using the mask plate on the color filter base substrate having the black matrix formed thereon comprises:
   applying a first color filter material on the color filter base substrate having the black matrix formed thereon and forming a first patterned color filter layer by using the mask plate;
   applying a second color filter material on the color filter base substrate having the first color filter layer formed thereon and forming a second patterned color filter layer by using the mask plate; and
   applying a third color filter material on the color filter base substrate having the second color filter layer formed thereon and forming a third patterned color filter layer by using the mask plate.

4. The method of claim 3, wherein a shape of the light transmitting region of a mask plate which is configured to form a post spacer is of a rectangle, a circular or an oval shape and an area of the light transmitting region is larger than a projected area of the post spacer to be formed on the color filter substrate.

5. The method of claim 3, wherein the step of forming a plurality of post spacers on the color filter layer and in a region corresponding to the black matrix comprises:
   applying a layer of organic material configured to fabricate the post spacers and a photoresist layer on the color filter layer having height difference; and
   exposing and developing the layer of organic material and the photoresist layer by using a mask plate to form the plurality of post spacers, wherein top surfaces of the plurality of post spacers are at the same horizontal level.

6. The method of claim 2, wherein a shape of the light transmitting region of a mask plate which is configured to form a post spacer is of a rectangle, a circular or an oval shape and an area of the light transmitting region is larger than a projected area of the post spacer to be formed on the color filter substrate.

7. The method of claim 2, wherein the step of forming a plurality of post spacers on the color filter layer and in a region corresponding to the black matrix comprises:
   applying a layer of organic material configured to fabricate the post spacers and a photoresist layer on the color filter layer having a height difference; and
   exposing and developing the layer of organic material and the photoresist layer by using a mask plate to form the plurality of post spacers, wherein top surfaces of the plurality of post spacers are at the same horizontal level.

8. A color filter substrate, comprising:
   a color filter base substrate;
   a patterned black matrix disposed on the color filter base substrate;
   a patterned color filter layer disposed on the color filter base substrate having the black matrix formed thereon, wherein a height of a color filter layer formed by using the central region of the mask plate of claim 1 is smaller than a height of a color filter layer formed by using the peripheral region of the mask plate; and
   a plurality of post spacers disposed on the color filter layer and in a region corresponding to the black matrix, wherein top surfaces of the plurality of post spacers away from the color filter base substrate are at the same horizontal level.

9. The color filter substrate of claim 8, wherein the patterned color filter layer disposed on the color filter base substrate having the black matrix formed thereon comprises:
   a plurality of first color filter layer, second color filter layer and third color filter layer having a strip shape and alternately arranged.

10. The color filter substrate of claim 9, wherein in the region configured to form the plurality of post spacers, a height difference of the color filter layer between the central region and the peripheral region is larger than 0 and less than or equal to 0.05 μm.

11. The color filter substrate of claim 8, wherein in the region configured to form the plurality of post spacers, a height difference of the color filter layer between the central region and the peripheral region is larger than 0 and less than or equal to 0.05 μm.

12. A display panel comprising the color filter substrate of claim 8.

13. The display panel of claim 12, wherein the patterned color filter layer disposed on the color filter base substrate having the black matrix formed thereon comprises:
   a plurality of first color filter layer, second color filter layer, and third color filter layer having a strip shape and alternately arranged.

14. The display panel of claim 12, wherein in the region configured to form the plurality of post spacers, a height difference of the color filter layer between the central region and the peripheral region is larger than 0 and less than or equal to 0.05 μm.

15. A display device comprising the display panel of claim 12.

* * * * *